United States Patent
Iwao et al.

(10) Patent No.: US 10,570,512 B2
(45) Date of Patent: Feb. 25, 2020

(54) SUBSTRATE PROCESSING APPARATUS

(71) Applicant: TOKYO ELECTRON LIMITED, Tokyo (JP)

(72) Inventors: Toshihiko Iwao, Miyagi (JP); Takahiro Hirano, Miyagi (JP); Kiyotaka Ishibashi, Miyagi (JP); Satoru Kawakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 554 days.

(21) Appl. No.: 14/624,799

(22) Filed: Feb. 18, 2015

(65) Prior Publication Data

US 2015/0232993 A1  Aug. 20, 2015

(30) Foreign Application Priority Data

Feb. 19, 2014 (JP) .................................. 2014-030057
Jan. 30, 2015 (JP) .................................. 2015-016499

(51) Int. Cl.
*H01J 37/32* (2006.01)
*C23C 16/455* (2006.01)

(52) U.S. Cl.
CPC .............................. *C23C 16/45536* (2013.01)

(58) Field of Classification Search
CPC . C23C 16/505; C23C 16/455; C23C 16/4584; C23C 16/511; C23C 16/463; C23C 16/45536; H01J 37/32192; H01J 37/32779; H01J 37/3244; H01J 37/3222
See application file for complete search history.

(56) References Cited

U.S. PATENT DOCUMENTS

| | | | |
|---|---|---|---|
| 2001/0008171 A1* | 7/2001 | Fukuda | H01J 37/32082 156/345.48 |
| 2007/0221294 A1* | 9/2007 | Sasaki | H01J 37/32192 148/222 |
| 2010/0183827 A1* | 7/2010 | Hirayama | C23C 16/511 427/575 |
| 2010/0240225 A1* | 9/2010 | Sato | H01J 37/32192 438/786 |

(Continued)

FOREIGN PATENT DOCUMENTS

| | | |
|---|---|---|
| JP | 2013-168437 A | 8/2013 |
| WO | 2011/021607 A1 | 2/2011 |
| WO | 2013/122043 A1 | 8/2013 |

*Primary Examiner* — Yuechuan Yu
(74) *Attorney, Agent, or Firm* — Rothwell, Figg, Ernst & Manbeck, P.C.

(57) ABSTRACT

A substrate processing apparatus of the present disclosure includes a placing table provided to be rotatable around an axis; a gas supplying section that supplies gas to regions through which a substrate sequentially passes while being moved in a circumferential direction with respect to the axis as the placing table is rotated; and a plasma generating section that generates plasma using the supplied gas. The plasma generating section includes an antenna that radiates microwaves, and a coaxial waveguide that supplies the microwaves to the antenna. Line segments constituting a plane shape of the antenna when viewed in a direction along the axis include two line segments which are spaced to be distant from each other as being spaced away from the axis. The coaxial waveguide supplies the microwaves to the antenna from a gravity center of the antenna.

21 Claims, 13 Drawing Sheets

(56) References Cited

U.S. PATENT DOCUMENTS

2011/0146910 A1* 6/2011 Hirayama ......... H01J 37/32192
 156/345.43
2013/0059415 A1* 3/2013 Kato ..................... C23C 16/345
 438/106

* cited by examiner

US 10,570,512 B2

SUBSTRATE PROCESSING APPARATUS

CROSS-REFERENCE TO RELATED APPLICATIONS

This application is based on and claims priority from Japanese Patent Application Nos. 2014-030057 and 2015-016499, filed on Feb. 19, 2014 and Jan. 30, 2015, respectively, with the Japan Patent Office, the disclosures of which are incorporated herein in their entireties by reference.

TECHNICAL FIELD

The present disclosure relates to a substrate processing apparatus.

BACKGROUND

As a kind of a technique of forming a film on a substrate, a plasma enhanced atomic layer deposition (PE-ALD) method has been known. In the PE-ALD method, a substrate is exposed to a precursor gas containing constituent elements of a thin film to be formed so that the precursor gas is chemically adsorbed to the substrate. Subsequently, the substrate is exposed to a purge gas to remove the precursor gas excessively chemically adsorbed to the substrate. Then, the substrate is exposed to plasma of a reaction gas containing constituent elements of a thin film to be formed to form a desired thin film on the substrate. In the PE-ALD method, such steps are repeated, so that a film, in which atoms or molecules contained in the precursor gas are processed, is generated on the substrate.

As an apparatus for performing the PE-ALD method, a semi-batch type film forming apparatus has been known. In the semi-batch type film forming apparatus, a region for supplying a precursor gas and a region for generating the plasma of a reaction gas are separately formed in the processing chamber and the substrate passes through the regions in sequence, so that a desired film is generated on the substrate.

The film forming apparatus includes a placing table, an injecting unit, and a plasma generating section. The placing table supports the substrate and is rotatable around a rotational axis. The injecting unit and the plasma generating section are disposed to face the placing table and arranged in the circumferential direction. The injecting unit has a substantially planar fan shape and supplies the precursor gas. The plasma generating section supplies the reaction gas and radiates microwaves supplied from a waveguide placed in a plane direction of a plate-shaped antenna from a substantially fan-shaped antenna, thereby generating plasma of the reaction gas. An exhaust port is formed around the injecting unit and around the plasma generating section and an injection port for supplying purge gas is formed on the periphery of the injecting unit. Further, a round antenna may be used in the plasma generating section. See, for example, International Publication No. WO 2013-122043.

SUMMARY

A substrate processing apparatus of the present disclosure includes a placing table configured to place a processing target substrate and provided to be rotatable around an axis such that the processing target substrate moves around the axis; a gas supplying section configured to supply gas to each of a plurality of regions through which the processing target substrate sequentially passes while being moved in a circumferential direction with respect to the axis as the placing table is rotated, the substrate moving; and a plasma generating section configured to generate plasma in the plasma generation region which is one region among the plurality of regions, using the gas supplied to a plasma generation region. The plasma generating section includes an antenna configured to radiate high frequency waves to the plasma generation region, and a power feeding unit configured to supply the high frequency waves to the antenna. Line segments constituting a plane shape of the antenna when viewed in a direction along the axis include two line segments which are spaced to be distant from each other as being spaced away from the axis. The power feeding unit supplies the high frequency waves to the antenna from a gravity center of the antenna.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
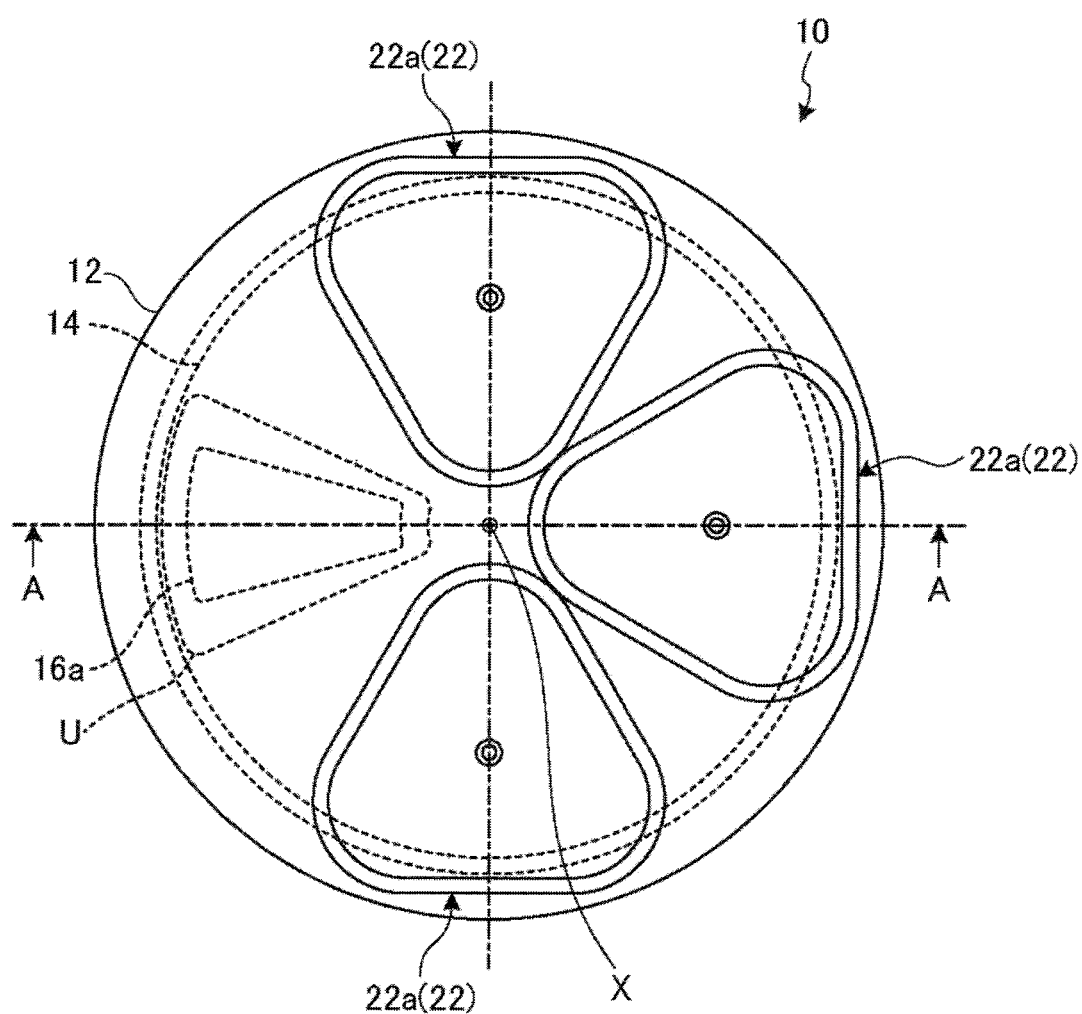
FIG. 1 is a plan view schematically illustrating a substrate processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

When an antenna that radiates microwaves in the plasma generating section is formed in a round shape, a region of plasma generated by the round antenna has a shape that follows the shape of the antenna. Therefore, in a semi-batch type film forming apparatus, a passing time of the substrate through the region of the generated plasma varies depending on the position of the substrate (a distance from a rotational center). As a result, it is difficult to perform uniform plasma processing on the substrate.

Meanwhile, when the antenna is formed in a fan shape, the region of the generated plasma has a shape that follows the shape of the fan-shaped antenna. Therefore, a passing time of the substrate passes through the region of the generated plasma may be uniform regardless of the position of the substrate. However, in the fan-shaped antenna, since the microwaves are supplied from the waveguide placed in the plane direction of the antenna, the microwaves are not uniformly supplied to the entire antenna. As a result, it is difficult to radiate highly uniform microwaves from the fan-shaped antenna, and as a result, it is difficult to increase the uniformity of the generated plasma.

In an exemplary embodiment, a substrate processing apparatus of the present disclosure includes a placing table configured to place a processing target substrate and provided to be rotatable around an axis such that the processing target substrate moves around the axis; a gas supplying section configured to supply gas to each of a plurality of regions through which the processing target substrate sequentially passes while being moved in a circumferential direction with respect to the axis as the placing table is rotated, the substrate moving; and a plasma generating section configured to generate plasma in the plasma generation region which is one region among the plurality of regions, using the gas supplied to a plasma generation region. The plasma generating section includes an antenna configured to radiate high frequency waves to the plasma generation region, and a power feeding unit configured to supply the high frequency waves to the antenna. Line segments constituting a plane shape of the antenna when viewed in a direction along the axis include two line segments which are spaced to be distant from each other as being spaced away from the axis. The power feeding unit supplies the high frequency waves to the antenna from a gravity center of the antenna.

In the above-mentioned substrate processing apparatus, the plane shape of the antenna when viewed in the direction along the axis has rotational symmetry.

In the above-mentioned substrate processing apparatus, the plane shape of the antenna when viewed in the direction along the axis is a substantially regular triangular shape.

In the above-mentioned substrate processing apparatus, each of the two line segments is longer than a diameter of the processing target substrate having a disc shape. The antenna is provided in the plasma generation region so that the processing target substrate on the placing table passes through an inside of two line segments when viewed in the direction along the axis.

In the above-mentioned substrate processing apparatus, the antenna is provided in the plasma generation region so that the center of the processing target substrate on the placing table passes through the centers of two line segments when viewed in the direction along the axis.

In the above-mentioned substrate processing apparatus, the plasma generating section further includes a stub that is inserted into the power feeding unit to control an insertion amount.

In the above-mentioned substrate processing apparatus, the two line segments are connected by a curve which is a part of a circle having a predetermined radius.

In the above-mentioned substrate processing apparatus, the plane shape of the antenna when viewed in the direction along the axis is constituted such that, in three interior angles of a substantially regular triangle formed when each of three sides constituting the plane shape extends, one interior angle is within a range of $60°±1°$ and the other two interior angles are within a range of $60°±0.5°$.

In the above-mentioned substrate processing apparatus, the high frequency waves are microwaves.

In the above-mentioned substrate processing apparatus, the power feeding unit is a coaxial waveguide.

In the above-mentioned substrate processing apparatus, the antenna includes a first dielectric; a slot plate provided on the first dielectric and connected with an inner conductor of the coaxial waveguide; a second dielectric provided on the slot plate; and a cooling plate provided on the second dielectric and having a flow path for circulating coolant therein. The slot plate includes a plurality of slot pairs each having two slots formed to be aligned side by side in concentric circular shapes having different radii around a position where the inner of the coaxial waveguide is connected when viewed in a direction along the axis. Further, the plurality of slot pairs is formed on the slot plate to be rotationally symmetric when viewed in the direction along the axis.

The above-mentioned substrate processing apparatus further includes a pressing unit disposed on a surface of the antenna where the coaxial waveguide is connected, so as to press the cooling plate against the second dielectric. The cooling plate, the second dielectric, the slot plate, and the first dielectric are in close contact with each other by a pressing force of the pressing unit.

According to an exemplary embodiment of the substrate processing apparatus of the present disclosure, the variation of the time for each position on the substrate to pass through the region of the plasma can be suppressed to be low and the uniformity of the generated plasma can be increased.

Hereinafter, an exemplary embodiment of a substrate processing apparatus of the present disclosure will be described in detail with reference to the accompanying drawings. Meanwhile, the present disclosure is not limited to exemplary embodiments disclosed herein. The respective exemplary embodiments may be appropriately combined within a range without contradicting processing contents.

(Exemplary Embodiment)

Figure 2:
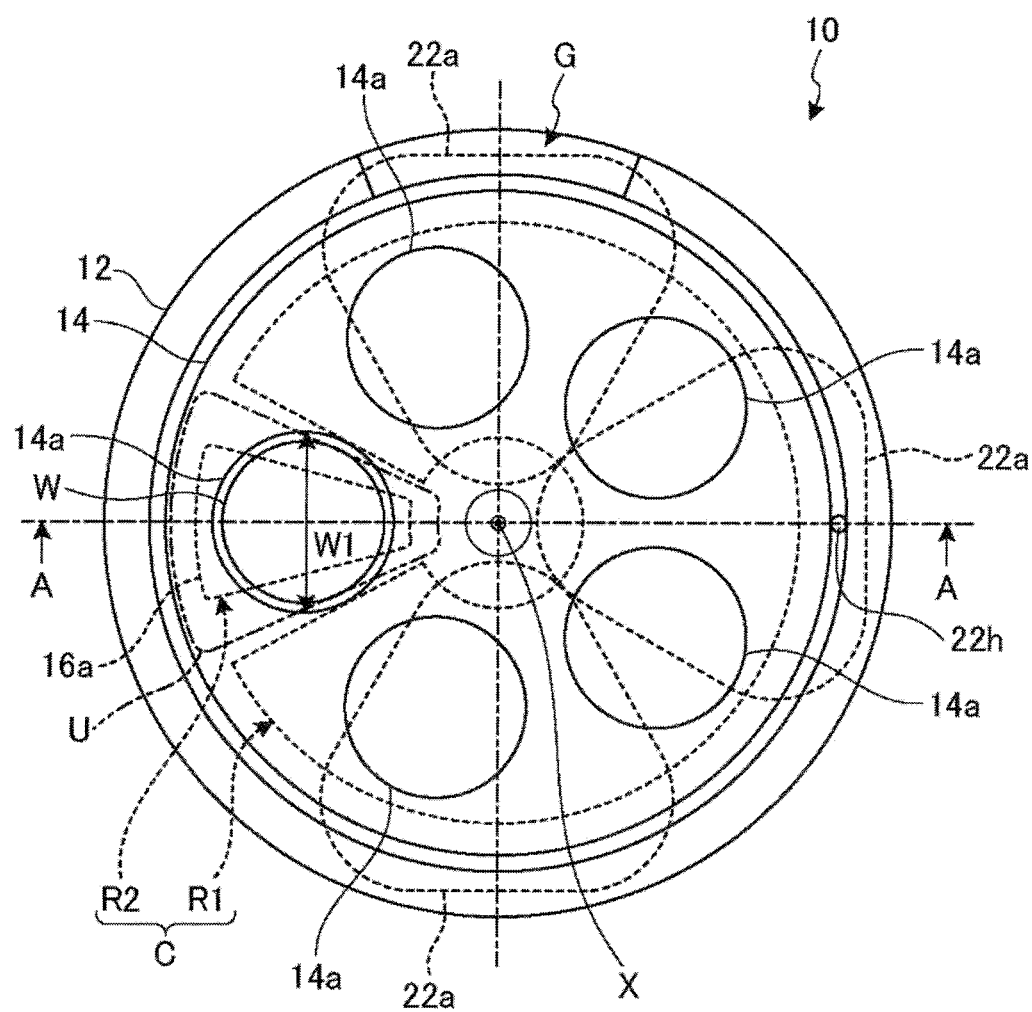
FIG. 2 is a plan view illustrating the substrate processing apparatus illustrated in FIG. 1 in a state where the top of a processing container is removed from the substrate processing apparatus.
Figure 3:
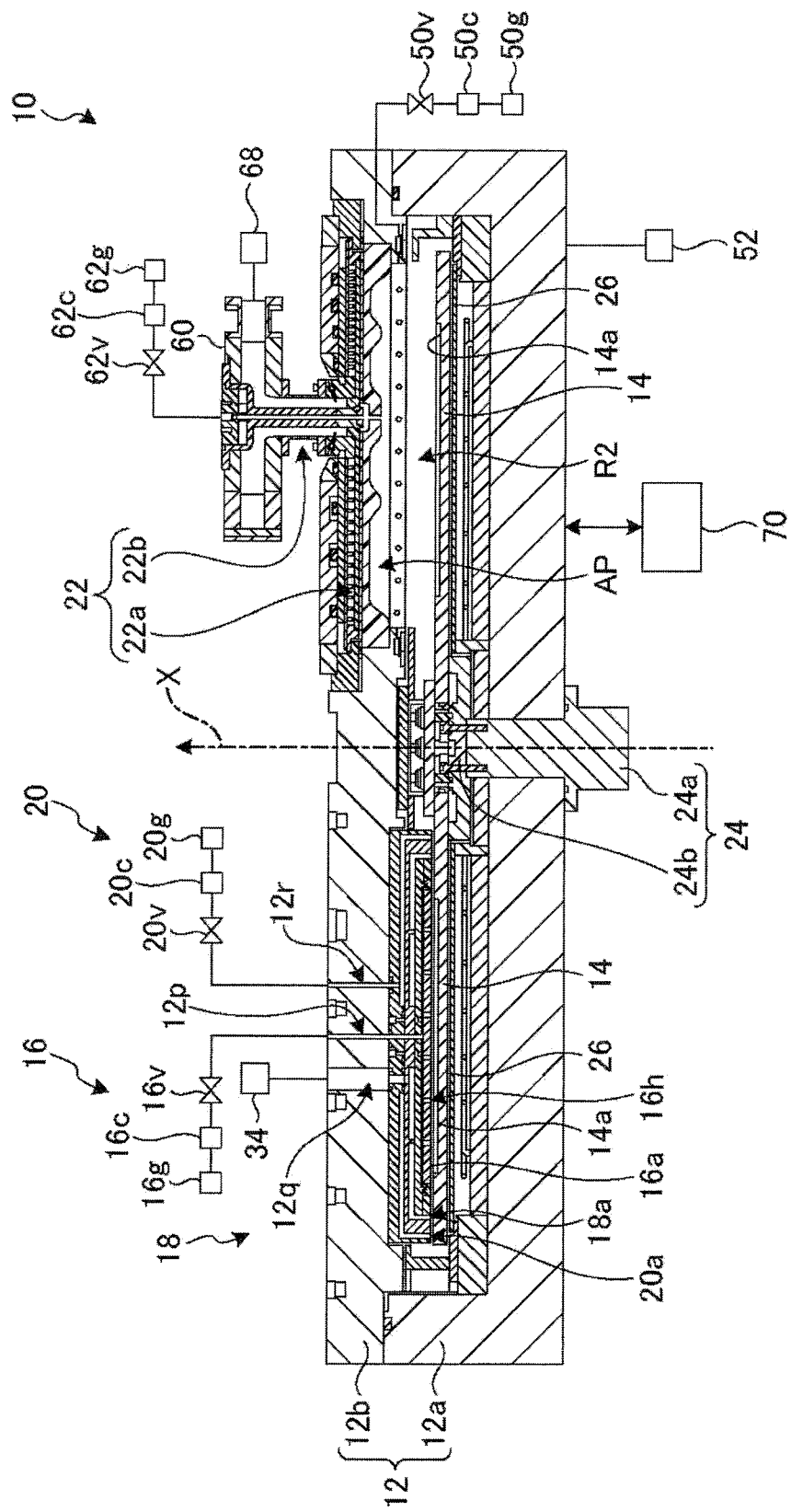
FIG. 3 is a cross-sectional view of the substrate processing apparatus taken along line A-A in FIGS. 1 and 2.
Figure 4:
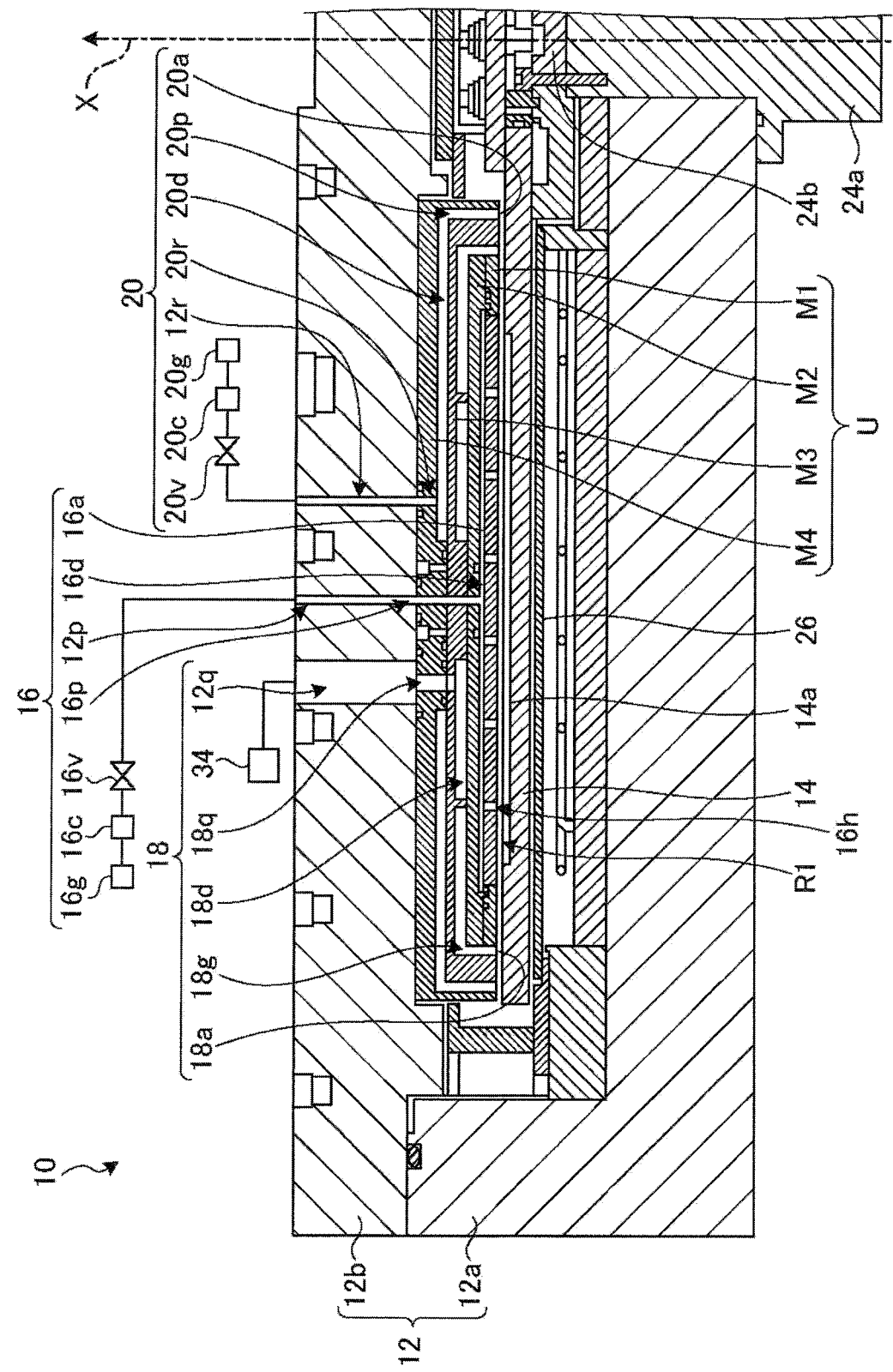
FIG. 4 is a cross-sectional view illustrating a left part of the axis X in FIG. 3 in an enlarged scale.
Figure 5:
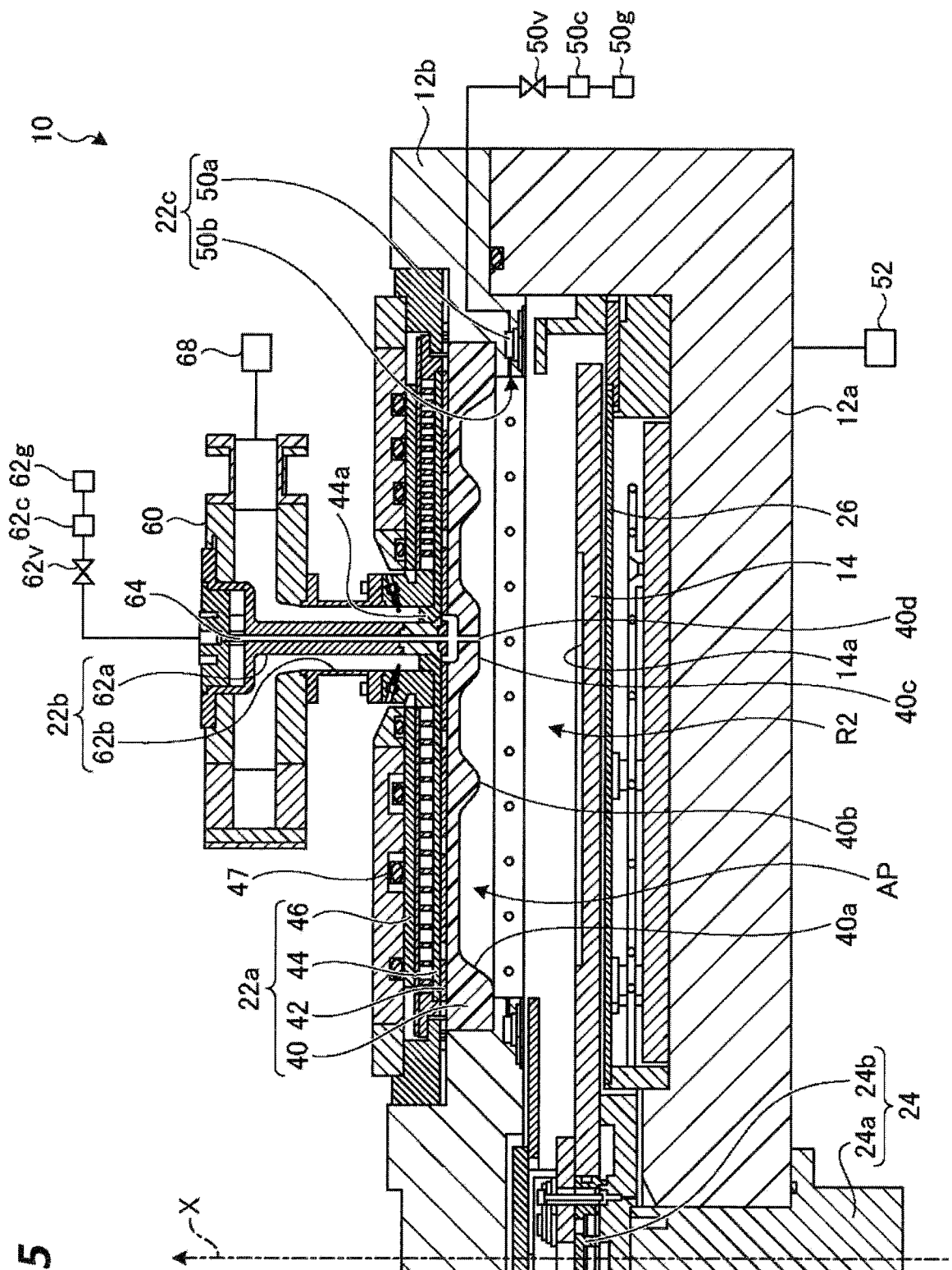
FIG. 5 is a cross-sectional view illustrating a right part of the axis X in FIG. 3 in an enlarged scale.

FIG. 1 is a plan view schematically illustrating a substrate processing apparatus according to an exemplary embodiment of the present disclosure. FIG. 2 is a plan view illustrating the substrate processing apparatus illustrated in FIG. 1 in a state where an upper member of a processing container is removed from the substrate processing apparatus. FIG. 3 is a cross-sectional view of the substrate processing apparatus taken along line A-A in FIGS. 1 and 2. FIG. 4 is a cross-sectional view illustrating a left part of the axis X in FIG. 3 in an enlarged scale. FIG. 5 is a cross-sectional view of a right part of an axis X in FIG. 3 in an enlarged scale. A substrate processing apparatus 10 illustrated in FIGS. 1 to 5 mainly includes a processing container 12, a placing table 14, a first gas supplying section 16, an exhaust section 18, a second gas supplying section 20, and a plasma generating section 22.

As illustrated in FIG. 1, the processing container 12 is a substantially cylindrical container which has an axis X as a central axis. The processing container 12 includes a processing chamber C therein. The processing chamber C includes a unit U having an injection section 16a. The processing container 12 is made of a metal such as, for example, aluminum (Al), of which the inner surface is subjected to an anti-plasma processing such as, for example, an alumite treatment or a thermal spraying treatment of yttrium oxide (Y2O3). The substrate processing apparatus 10 has a plurality of plasma generating sections 22 in the processing container 12. Each plasma generating section 22 includes an antenna 22a that outputs microwaves at the top side of the processing container 12. The number of antennas 22a provided at the top side the processing container 12 is not limited to those illustrated in FIGS. 1 and 2 and may be properly changed.

As illustrated in FIG. 2, the substrate processing apparatus 10 includes the placing table 14 having a plurality of substrate placing regions 14a thereon. The placing table 14 is a substantially disk-shaped member which has an axis X as a central axis. On the top of the placing table 14, a plurality of substrate placing regions 14a (five in the example of FIG. 2), is concentrically formed around the axis X to place substrates W therein. Each substrate W is placed in one of the substrate placing regions 14a, and the substrate placing regions 14a support the substrates W so that the substrates W are not deviated when the placing table 14 rotates. The substrate placing regions 14a are substantially circular concave portions which have substantially the same shape as the substantially circular substrates W. A diameter W1 of the concave portions of the substrate placing regions 14a is approximately the same as the diameter of the substrates W placed in the substrate placing regions 14a. That is, the diameter W1 of the concave portions of the substrate placing regions 14a may be set to allow the substrates W placed therein to be engaged with the concave portions, respectively, such that the substrates W are not shifted from the engagement positions by centrifugal force even if the placing table 14 rotates.

The substrate processing apparatus 10 includes a gate valve G formed on a side wall thereof, through which the substrates W are carried into/out of the processing chamber C using a conveying device such as, for example, a robot arm. Further, the substrate processing apparatus 10 includes an outlet 22h below the outer edge of the placing table 14. An exhaust device 52 is connected to the outlet 22h. The substrate processing apparatus 10 controls the operation of the exhaust device 52 to maintain the pressure in the processing chamber C to a desired pressure.

As illustrated in FIG. 3, the processing container 12 includes a lower member 12a and an upper member 12b. The lower member 12a has an upwardly opened and substantially cylindrical shape, and forms a concave portion including a side wall and a bottom wall which form the processing chamber C. The upper member 12b is a cover which has a substantially cylindrical shape and forms the processing chamber C by covering and closing the top opening of the concave portion of the lower member 12a. An elastic sealing member for sealing the processing chamber C, for example, an O-ring, may be provided on an outer periphery between the lower member 12a and the upper member 12b.

The substrate processing apparatus 10 includes the placing table 14 provided inside the processing chamber C formed by the processing container 12. The placing table 14 is rotatably driven around the axis X by a driving mechanism 24. The driving mechanism 24 includes a driving device 24a such as, for example, a motor and a rotation shaft 24b, and is attached to the lower member 12a of the processing container 12.

The rotation shaft 24b extends to the inside of the processing chamber C by setting the axis X as the central axis. The rotation shaft 24b rotates around the axis X by the driving force transferred from the driving device 24a. The central portion of the placing table 14 is supported by the rotation shaft 24b. Accordingly, the placing table 14 rotates by rotating the rotation shaft 24b around the axis X. Meanwhile, an elastic sealing member such as, for example, an O ring, may be provided between the lower member 12a of the processing container 12 and the driving mechanism 24 to seal the processing chamber C.

Below the placing table 14 in the processing chamber C, the substrate processing apparatus 10 includes a heater 26 that heats the substrates W placed in the substrate placing regions 14a. Specifically, the substrate W is heated by heating the placing table 14. The substrates W are conveyed to the processing chamber C by a conveying device such as, for example, a robot arm (not illustrated) through the gate valve G provided in the processing container 12, and placed in the substrate placing regions 14a. Further, the substrates W are removed from the processing chamber C through the gate valve G by the conveying device.

The processing chamber C forms a first region R1 (see FIG. 2) and a second region R2 which are arranged on a circumference around the axis X. The substrate W placed in the substrate placing region 14a sequentially passes the first region R1 and the second region R2 according to the rotation of the placing table 14.

As illustrated in FIG. 4, in the substrate processing apparatus 10, the first gas supplying section 16 is disposed above the first region R1 so as to face the top of the placing table 14. The first gas supplying section 16 is provided with an injection section 16a. That is, among the regions included in the processing chamber C, a region facing the injection section 16a is the first region R1.

The injection section 16a includes a plurality of injection ports 16h. The first gas supplying section 16 supplies a precursor gas to the first region R1 from the plurality of injection ports 16h. The precursor gas is supplied to the first region R1 so that atoms or molecules of the precursor gas are chemically adsorbed on the surface of the substrates W passing though the first region R1. The precursor gas includes, for example, dichlorosilane (DCS), monochlorosilane, trichlorosilane, or the like.

Above the first region R1, an exhaust port 18a of the exhaust section 18 is formed to face the top of the placing table 14. The exhaust port 18a is formed around the injection section 16a. The exhaust section 18 exhausts the gas in the processing chamber C through the exhaust port 18a by the operation of the exhaust device 34 such as, for example, a vacuum pump.

Above the first region R1, an injection port 20a of the second gas supplying section 20 is formed to face the top of the placing table 14. The injection port 20a is formed around the exhaust port 18a. The second gas supplying section 20 supplies a purge gas to the first region R1 through the injection port 20a. The purge gas supplied by the second gas supplying section 20 is an inert gas such as, for example, argon (Ar). The purge gas is injected to the surfaces of the substrates W to remove the atoms or the molecules (a residual gas component) of the precursor gas excessively chemically adsorbed on the substrates W from the substrates W. Accordingly, the atoms or the molecules of the precursor gas are chemically adsorbed on the surfaces of the substrates W to form an atom layer or a molecular layer.

The substrate processing apparatus 10 injects the purge gas from the injection port 20a to exhaust the purge gas from the exhaust port 18a along the surface of the placing table 14. Accordingly, the substrate processing apparatus 10 suppresses the precursor gas supplied to the first region R1 from leaking out to the outside of the first region R1. Further, since the purge gas is injected from the injection port 20a to exhaust the purge gas from the exhaust port 18a along the surface of the placing table 14, the substrate processing apparatus 10 suppresses reaction gas supplied to the second region R2 or radicals of the reaction gas from infiltrating into the region R1. That is, in the substrate processing apparatus 10, the first region R1 and the second region R2 are divided by the injection of the purge gas from the second gas supplying section 20 and the exhaust from the exhaust section 18.

Meanwhile, the substrate processing apparatus 10 includes a unit U including the injection section 16a, the exhaust port 18a, and the injection port 20a. That is, the injection section 16a, the exhaust port 18a, and the injection port 20a are formed as a portion constituting the unit U. As illustrated in FIG. 4, the unit U has a structure in which a first member M1, a second member M2, a third member M3 and a fourth member M4 are sequentially stacked. The unit U is attached to the processing container 12 to be in contact with the lower surface of the upper member 12b of the processing container 12.

As illustrated in FIG. 4, in the unit U, a gas supply path 16p is formed to pass through the second to fourth members M2 to M4. The upper end of the gas supply path 16p is connected with a gas supply path 12p formed in the upper member 12b of the processing container 12. The gas supply path 12p is connected with a gas supply source 16g of the precursor gas through a valve 16v and a flow rate controller 16c such as, for example, a mass flow controller. Further, the lower end of the gas supply path 16p is connected to a space 16d formed between the first member M1 and the second member M2. The space 16d is connected with the injection port 16h of the injection section 16a formed in the first member M1.

In the unit U, a gas supply path 20r is formed to pass through the fourth member M4. The upper end of the gas supply path 20r is connected with a gas supply path 12r formed in the upper member 12b of the processing container 12. The gas supply path 12r is connected with a gas supply source 20g of the purge gas through a valve 20v and a flow rate controller 20c such as, for example, a mass flow controller.

In the unit U, the lower end of the gas supply path 20r is connected to a space 20d formed between the lower surface of the fourth member M4 and the top of the third member M3. Further, the fourth member M4 forms a concave portion for accommodating the first member M1 to the third member M3. A gap 20p is formed between the inside of the fourth member M4 forming the concave portion and the outside of the third member M3. The gap 20p is connected to the space 20d. The lower end of the gap 20p serves as the injection port 20a.

In the unit U, an exhaust path 18q is formed to pass through the third member M3 and the fourth member M4. The upper end of the exhaust path 18q is connected with an exhaust path 12q formed at the upper member 12b of the processing container 12. The exhaust path 12q is connected to an exhaust device 34 such as, for example, a vacuum pump. Further, the lower end of the exhaust path 18q is connected to a space 18d formed between the lower surface of the third member M3 and the top of the second member M2.

The third member M3 has a concave portion for accommodating the first member M1 and the second member M2. A gap 18g is formed between the inside of the third member M3 configuring the concave portion included in the third member M3 and the outsides of the first member M1 and the second member M2. The space 18d is connected to the gap 18g. The lower end of the gap 18g functions as the exhaust port 18a. The substrate processing apparatus 10 suppresses the precursor gas supplied to the first region R1 from leaking out to the outside of the first region R1 by injecting the purge gas from the injection port 20a to exhaust the purge gas from the exhaust port 18a along the surface of the placing table 14.

As illustrated in FIG. 5, the substrate processing apparatus 10 includes the plasma generating section 22 provided in an aperture AP of the upper member 12b which is the top of the second region R2, to face the top of the placing table 14. The plasma generating section 22 includes an antenna 22a, and a coaxial waveguide 22b that supplies microwaves and a reaction gas to the antenna 22a. The coaxial waveguide 22b is an example of the power feeding unit. For example, three apertures AP are formed in the upper member 12b, and the substrate processing apparatus 10 includes, for example, three plasma generating sections 22.

The plasma generating unit 22 generates plasma of the reaction gas in the second region R2 by supplying the reaction gas and the microwaves to the second region R2. When a nitrogen-containing gas is used as the reaction gas, the atom layer or the molecular layer which is chemically adsorbed on the substrate W is nitrified. As the reaction gas, for example, a nitrogen-containing gas such as, for example, nitrogen ($N_2$) or ammonia ($NH_3$) may be used.

As illustrated in FIG. 5, the antenna 22a is hermetically placed in the plasma generating section 22 to block the aperture AP. The antenna 22a includes a top plate 40, a slot plate 42, a slow wave plate 44, and a cooling plate 46. The top plate 40 is a substantially regular-triangular member having round angles (rounded corners). The top plate 40 is made of a dielectric material such as, for example, alumina ceramics. The top plate 40 is an example of the first dielectric. The top plate 40 is supported by an upper member 12b so that the bottom of the top plate 40 is exposed to the second region R2 from the aperture AP formed in the upper portion 12b of the processing container 12. In the bottom of the top plate 40, a first rib 40a is formed along the outer edge of the top plate 40, and further, a second rib 40b having a substantially circular shape is formed inside the top plate 40. Further, inside the second rib 40b, a protrusion 40c is formed to downwardly protrude, and at substantially the center of the projection 40c, an injection port 40d is formed to penetrate the projection 40c in a thickness direction.

The bottom of the top plate 40, that is, the surface of the top plate 40 exposed to the second region R2 may be coated with $Al_2O_3$, $Y_2O_3$, or a $YO_xF_y$-based film (x is an integer of 0 or more, and y is an integer of 1 or more). The $YO_xF_y$-based film may be, for example, $YF_3$ film. The coating may be performed by spraying or aerosol deposition. Accordingly, it is possible to suppress contamination caused by incorporation of materials of the top plate 40 into the substrate W during the processing. Further, although the bottom of the top plate 40 illustrated in FIG. 5 has unevenness formed by the first rib 40a and the second rib 40b, the bottom of the top plate 40 may be flat. Therefore, it is possible to enhance the adhesion of the coating film formed on the bottom of the top plate 40 in order to suppress the contamination.

The slot plate 42 is disposed on the top of the top plate 40. The slot plate 42 is a substantially plate-shaped metallic member having a substantially regular triangular shape having round angles. In the slot plate 42, in an axis X direction, an aperture is formed at a position overlapping with the injection port 40d of the top plate 40. Further, a plurality of slot pairs is formed in the slot plate 42. Each slot pair includes two slot holes that are perpendicular to each other or cross each other. The slot pairs are formed in a circumferential direction in concentric circle forms with different radii in the plane of the slot plate 42. The center of the concentric circles is, for example, the center of gravity of the slot plate 42 when viewed in the axis X direction.

The slow wave plate 44 is provided on the top of the slot plate 42. The slow wave plate 44 is a substantially regular-triangular member having round angles. The slow wave plate 44 is made of a dielectric material such as, for example, alumina ceramics. The slow wave plate 44 is an example of the second dielectric. In the slow wave plate 44, a substantially cylindrical aperture 22b is formed so as to place an outer conductor 62b of the coaxial waveguide therein. In the inner diameter side end of the slow wave plate 44 forming the periphery of the aperture, a ring-shaped projection 44a is formed to protrude in a thickness direction of the slow wave plate 44. The slow wave plate 44 is attached on the slot plate 42 so that the projection 44a protrudes upwards.

A cooling plate 46 is provided on the top of the slow wave plate 44. The cooling plate 46 cools the antenna 22a through the slow wave plate 44, by a coolant flowing through a flow path formed therein. The surface of the cooling plate 46 is made of a metal. Pressing units 47 are provided on the cooling plate 46 to press the entire surface or multiple portions of the cooling plate 46 against the slow wave plate 44. The pressing units 47 may be configured using a spring such as, for example, a spiral spring gasket. The cooling plate 46, the slow wave plate 44, the slot plate 42, and the top plate 40 are in close contact with each other by the pressing force of the pressing units 47. Therefore, even though the top plate 40 becomes wrinkled due to the atmospheric pressure or heat from the plasma, the cooling plate 46, the slow wave plate 44, the slot plate 42, and the top plate 40 may be maintained in close contact. As a result, the antenna 22a may efficiently dissipate heat through the cooling plate 46. Further, deformation of the antenna 22a is suppressed by the heat dissipation of the antenna 22a through the cooling plate 46. And, as deformation of the slots is suppressed, the variation of the electromagnetic field distribution formed by the microwaves radiated to the second region R2 is suppressed.

The coaxial waveguide 22b includes a hollow inner conductor 62a having a substantially cylindrical shape and an outer conductor 62b. The inner conductor 62a passes through the aperture of the slow wave plate 44 and the aperture of the slot plate 42 above the antenna 22a. A space 64 in the inner conductor 62a is communicated with the injection port 40d of the top plate 40. Further, a gas supply source 62g of the reaction gas is connected to the upper end of the inner conductor 62a through a valve 62v and a flow rate controller 62c such as, for example, a mass flow controller. The reaction gas supplied to the coaxial waveguide 22b from the valve 62v is supplied to the second region R2 through the space 64 in the inner conductor 62a and the injection port 40d of the top plate 40.

The outer conductor 62b is formed to surround the inner conductor 62a with a gap between an outer peripheral surface of the inner conductor 62a and an inner peripheral surface of the outer conductor 62b. The lower end of the outer conductor 62b is connected to an aperture of the cooling plate 46.

The substrate processing apparatus 10 includes a waveguide 60 and a high frequency wave generator 68. The high frequency wave generator 68 generates high frequency waves included in a band of, for example, 1 MHz to 3 THz. In the present exemplary embodiment, the high frequency wave generator 68 generates microwaves included in a band of 300 MHz to 3 THz (e.g., microwaves of 2.45 GHz). The microwaves generated by the high frequency wave generator 68 are propagated to the coaxial waveguide 22b through the waveguide 60 and propagated to the gap between the inner conductor 62a and the outer conductor 62b. In addition, the microwaves propagated to the inside of the slow wave plate 44 are propagated to the top plate 40 from the slot holes of the slot plate 42 and radiated to the second region R2 from the top plate 40.

The reaction gas is supplied to the second region R2 from the reaction gas supplying section 22c. The reaction gas supplying section 22c includes a gas supplying section 50a and an injection section 50b. A plurality of gas supplying sections 50a is provided, for example, inside the upper member 12b of the processing container 12 so as to extend to the vicinity of the aperture AP. The injection section 50b injects the reaction gas supplied from the gas supplying section 50a toward the lower side of the top plate 40. A gas supply source 50g of the reaction gas is connected to the gas supplying section 50a through a valve 50v and a flow rate controller 50c such as a mass flow controller.

The plasma generating section 22 supplies the reaction gas to the second region R2 by the injection port 40d of the top plate 40 and the injection section 50b of the reaction gas supply unit 22c, and radiates the microwaves to the second region R2 by the antenna 22a. As a result, plasma of the reaction gas is generated in the second region R2.

As illustrated in FIG. 3, the substrate processing apparatus 10 includes a controller 70 for controlling each constituent element of the substrate processing apparatus 10. The controller 70 may be a computer including a control device such as a central processing unit (CPU), a storage device such as a memory, and input and output devices. The controller 70 controls each constituent element of the substrate processing apparatus 10 by operating the CPU according to a control program stored in the memory.

The controller 70 transmits a control signal controlling a rotation speed of the placing table 14 to the driving device 24a. Further, the controller 70 sends a control signal controlling a temperature of the substrate W to a power supply connected to the heater 26. Further, the controller 70 sends a control signal controlling a flow rate of the precursor gas to the valve 16v and the flow rate controller 16c. Further, the controller 70 transmits a control signal controlling an exhaust amount of the exhaust device 34 connected to the exhaust port 18a to the exhaust device 34.

The controller 70 transmits a control signal controlling a flow of the purge gas to the valve 20v and the flow rate controller 20c. Further, the controller 70 transmits a control signal controlling a power of the microwaves to the microwave generator 68. Further, the controller 70 transmits a control signal controlling a flow rate of the reaction gas to the valve 50v, the valve 62v, the flow rate controller 50c, and the flow rate controller 62c. Further, the controller 70 transmits a control signal controlling an exhaust amount from the exhaust port 22h to the exhaust device 52.

Figure 6:
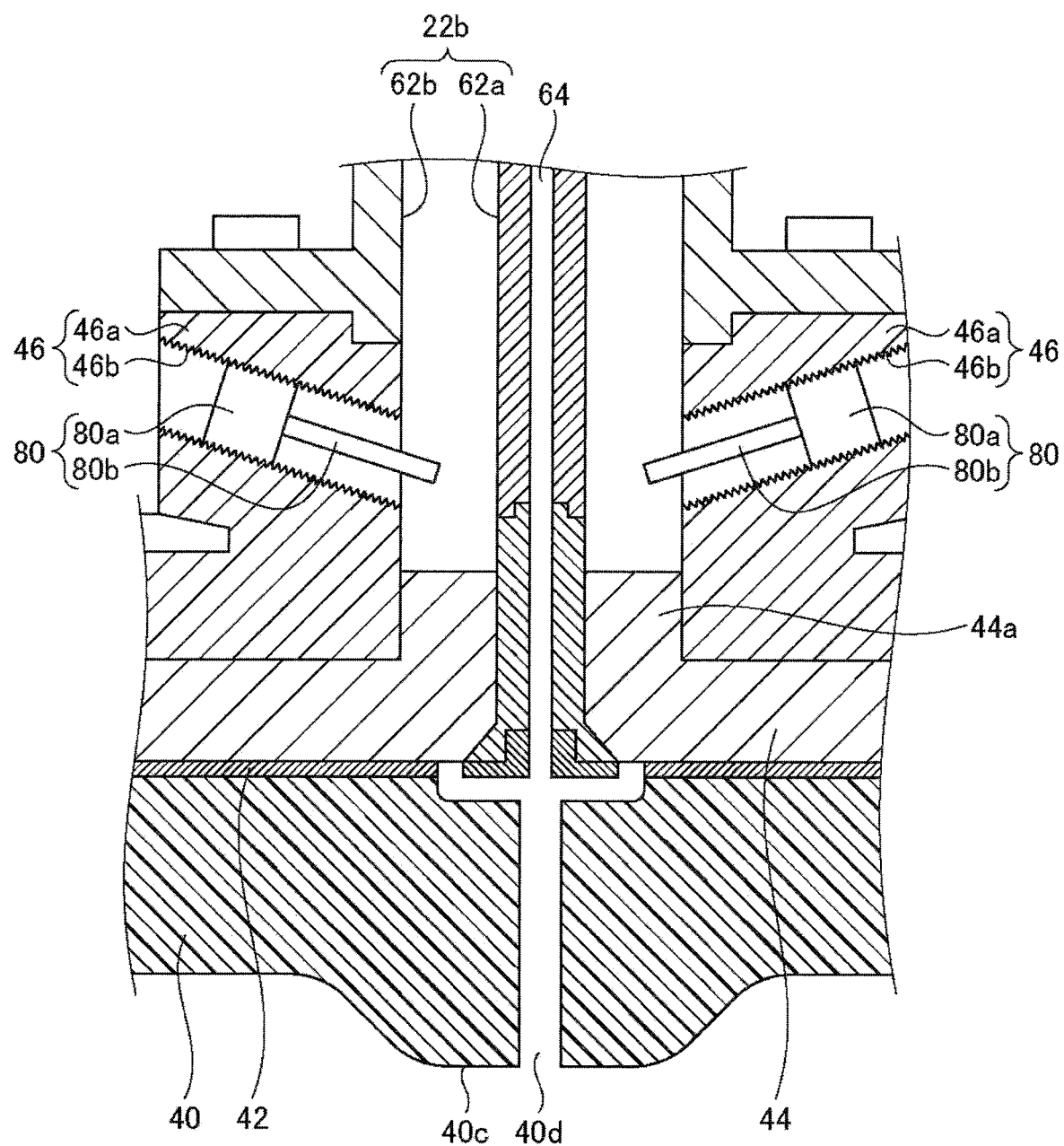
FIG. 6 is a cross-sectional view illustrating a connection part between a coaxial waveguide and an antenna in an enlarged scale.

FIG. 6 is a cross-sectional view illustrating a connection part between a coaxial waveguide 22b and an antenna 22a in an enlarged scale. The cooling plate 46 has substantially a plate shape and is formed with an aperture at the center thereof so as to place the coaxial waveguide 22b therein. The inner diameter side end of the cooling plate 46 forming the periphery of the aperture protrudes in the thickness direction. That is, the cooling plate 46 has a ring-shaped protrusion 46a that protrudes from the inner diameter side end in the plate thickness direction. The cooling plate 46 is attached onto the antenna 22a so that the protrusion 46a becomes the top.

The bottom of the outer conductor 62b is connected to the top of the protrusion 46a. The inner peripheral surface of the outer conductor 62b and the inner peripheral surface of the protrusion 46a are continued and a radial direction distance between the outer peripheral surface of the inner conductor 62a and the inner peripheral surface of the outer conductor 62b is configured to be substantially the same as a radial direction distance between the outer peripheral surface of the inner conductor 62a and the inner peripheral surface of the protrusion 46a. Meanwhile, a gap formed between the outer peripheral surface of the inner conductor 62a and the inner peripheral surface of the protrusion 46a is positioned above the protrusion 44a.

A screw hole 46b is formed in the protrusion 46a to extend downward obliquely toward an inner periphery side from an outer periphery side of the cooling plate 46. Threads are formed on the inner surface of the screw hole 46b. A stub member 80 is inserted into the screw hole 46b. The stub member 80 has a screw portion 80a having threads formed on the outer periphery and a bar shape portion 80b. The screw portion 80a is rotated to move the entirety of the stub member 80 including the bar shape portion 80b along the screw hole 46b according to a rotational amount thereof.

A plurality of (for example, six) stub members 80 is formed in the protrusion 46a around the inner conductor 62a so that a front end of each bar shape portion 80b faces the inner conductor 62a. The screw portions 80a of the respective stub members 80 are rotated to individually control the insertion amount of the bar shape portions 80b into a clearance formed between the outer peripheral surface of the inner conductor 62a and the inner peripheral surface of the protrusion 46a. The insertion amount of the bar shape portions 80b is controlled to control the distribution of the microwaves radiated to the second region R2 from the bottom of the top plate 40.

Figure 7:
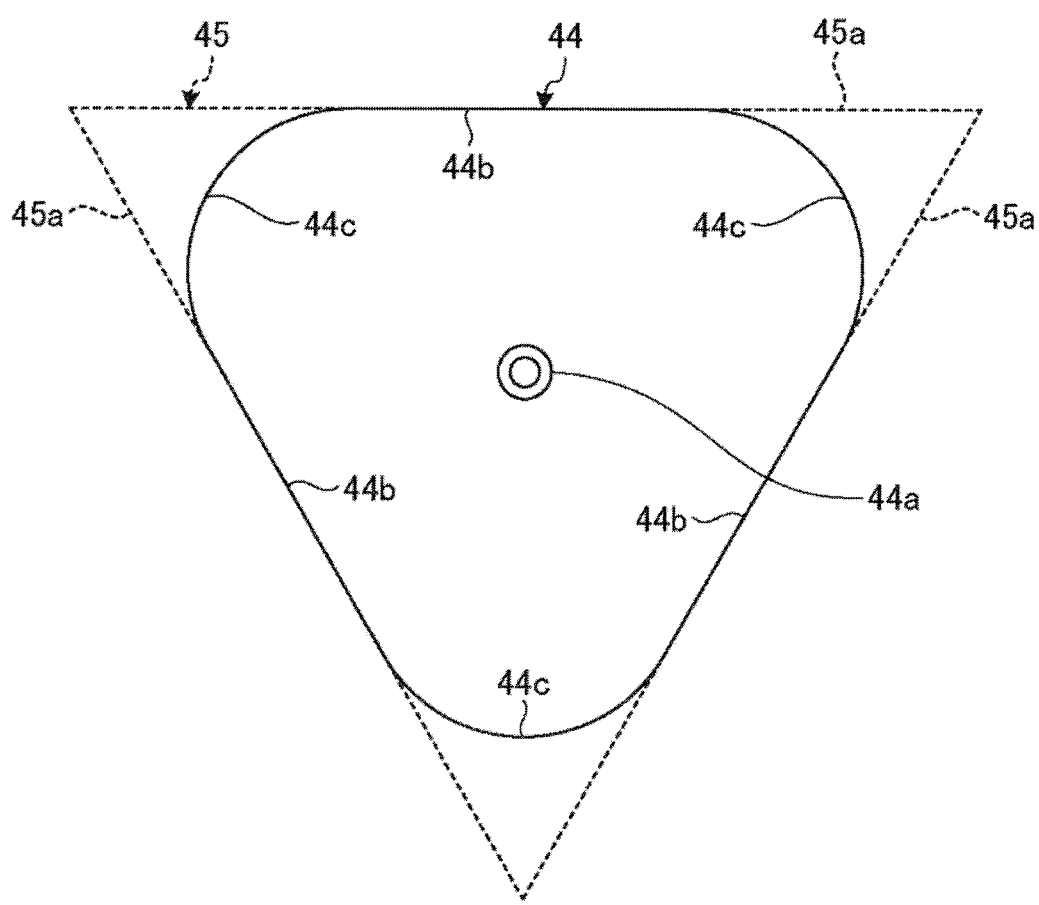
FIG. 7 is a plan view illustrating an exemplary schematic shape of a slow wave plate.

FIG. 7 is a plan view illustrating an exemplary schematic shape of a slow wave plate 44. A plane shape of the slow wave plate 44 when viewed in the direction of the axis X has a substantially regular triangular shape with rounded angles in which three lines 44b and three lines 44c are included in an outer shape thereof. The lines 44b are included in sides 45a constituting the substantially regular triangular shape 45, respectively. The lines 44c connect ends of contiguous lines 44b by a curve which is convex to the outside of the slow wave plate 44. Each of the lines 44c is, for example, a part of a circle having a predetermined radius. As a result, it is possible to suppress stress from being concentrated on a specific position in the slow wave plate 44.

The plane shape of the slow wave plate 44 viewed in the direction of the axis X may be a shape having rotational symmetry (for example, three-time symmetry). In addition, the protrusion 44a may be formed at the center (for example, the center of gravity) of the slow wave plate 44. As a result, the microwaves propagated between the inner conductor 62a and the outer conductor 62b of the coaxial waveguide 22b are propagated into the slow wave plate 33 from the top of the protrusion 44a more uniformly than in the slow wave plate having the fan shape, for example. As a result, the microwaves propagated into the slow wave plate 44 are uniformly propagated by the slot plate 42. Meanwhile, the fan shape has two line segments that are separated to be distant from each other as being spaced away from the axis X in line segments constituting the plane shape viewed in the direction of the axis X, but does not have the rotational symmetry.

Herein, in the case of the fan-shaped antenna, the microwaves are supplied through the waveguide placed on the top of the antenna in the plane direction of the antenna. As a result, since the cooling plate 46 may not be placed on the top of the antenna, heat of the antenna may not efficiently be dissipated. Therefore, in the case of the fan-shaped antenna, the antenna may be deformed or broken by the generated heat. In this regard, in the antenna 22a of the present exemplary embodiment, the microwaves are supplied from the center (e.g., the center of gravity) of the slow wave plate 44. As a result, a lot of regions of the top (the top of the slow wave plate 44) of the antenna 22a may be in close contact with the cooling plate 46. Therefore, the heat of the antenna 22 may be efficiently dissipated to suppress the deformation or cracking of the antenna 22a by the heat.

Figure 8:
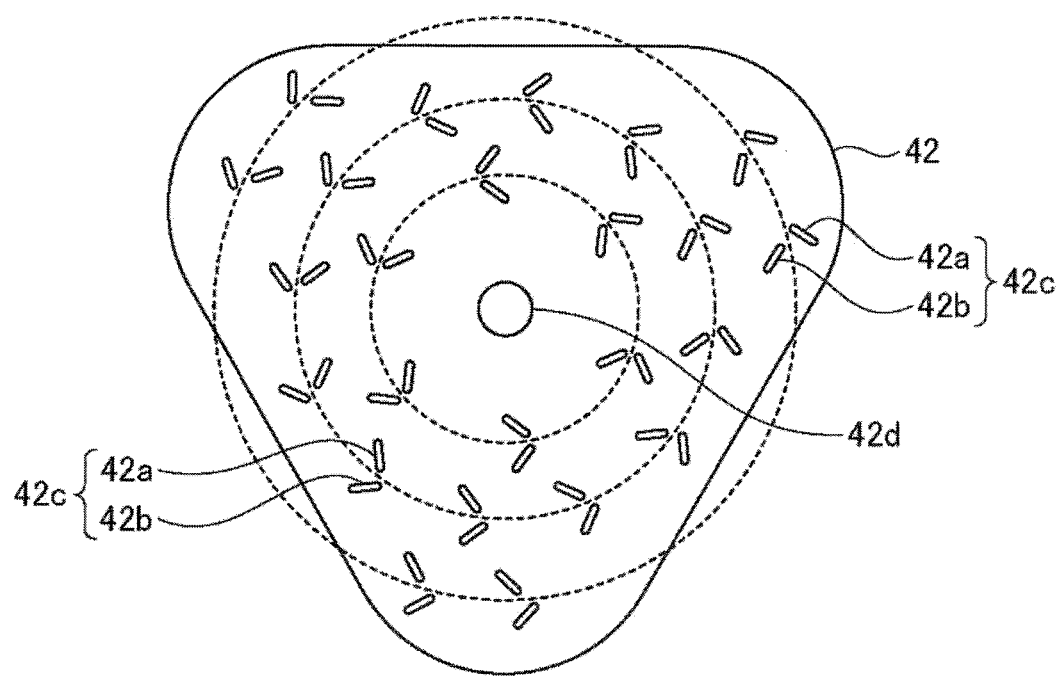
FIG. 8 is a plan view illustrating an exemplary schematic shape of a slot plate.

FIG. 8 is a plan view illustrating an exemplary schematic shape of the slot plate 42. The slot plate 42 is a plate-shaped metal member and the plane shape when viewed in the direction of the axis X is, for example, the same shape as the slow wave plate 44. An aperture 42d is formed in a plane of the slot plate 42 (e.g., the center of gravity of the slot plate 42) to penetrate the slot plate 42 in the thickness direction. Further, in the slot plate 42, a plurality of slot pairs 42c are formed on concentric circles having different radii centering on the aperture 42d. In the exemplary embodiment, the plurality of slot pairs 42c are formed along each of three concentric circles having different radii.

Each of the respective slot pairs 42c includes slots 42a and 42b that penetrate the slot plate 42 in the thickness direction. Each of the slots 42a and 42b is formed in an elongated elliptical shape. Slots 42a and 42b included in each of the slot pairs 42c are arranged substantially in an L shape.

The plurality of slot pairs 42c may be arranged on the slot plate 42 with the rotational symmetry (for example, three-time symmetry) when viewed in the direction of the axis X. As a result, the microwaves propagated from the slow wave plate 44 may be more uniformly propagated to the top plate 40.

Figure 9:
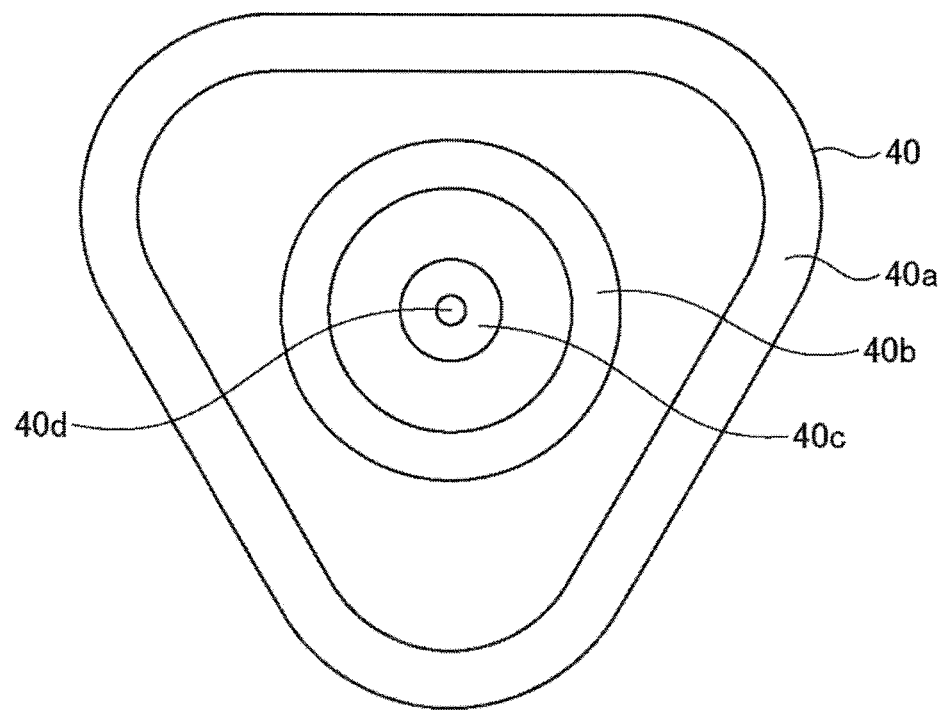
FIG. 9 is a plan view illustrating an exemplary schematic shape of a top plate.

FIG. 9 is a plan view illustrating an exemplary schematic shape of the top plate 40. In FIG. 9, the top plate 40 is illustrated when viewed from a side exposed to the second region R2. The plane shape of the top plate 40 when viewed in the direction of the axis X is, for example, the same as the shape of the slow wave plate 44 and is formed to be a slightly larger than the slow wave plate 44. A first rib 40a is formed along the outer periphery of the top plate 40 and a substantially circular second rib 40b is formed inside the top plate 40, on the bottom of the top plate 40. Further, the protrusion 40c is formed inside the second rib 40b to protrude downward and an injection port 40d is formed substantially at the center of the protrusion 40c to penetrate the top plate 40 in the thickness direction.

Figure 10:
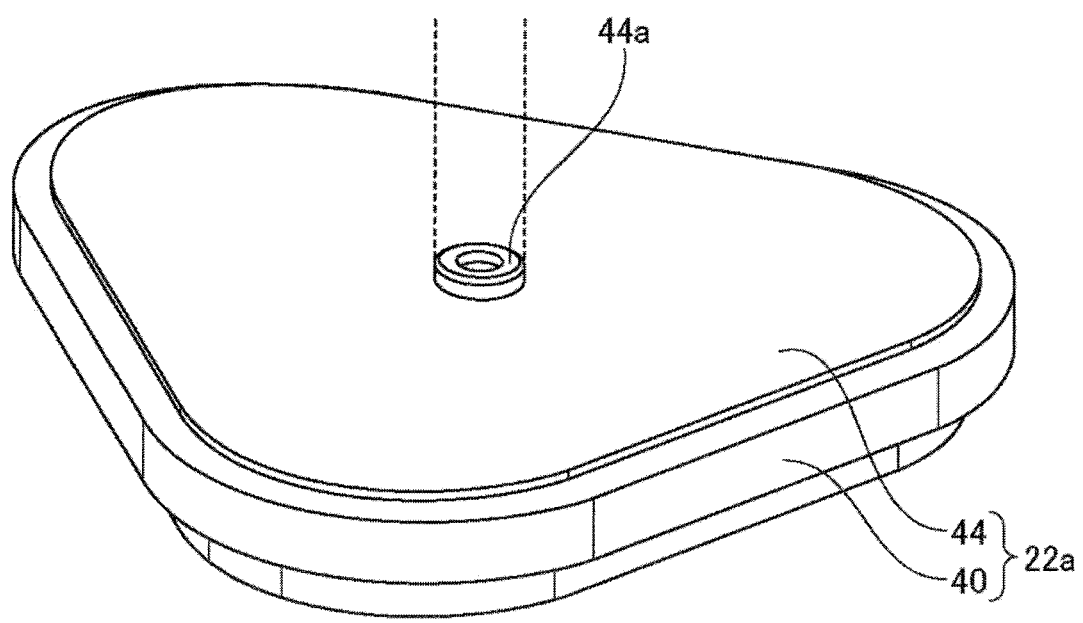
FIG. 10 is a perspective view illustrating an exemplary schematic shape of the entire antenna.

FIG. 10 is a perspective view illustrating an exemplary schematic shape of the entire antenna 22a. When viewed in the direction of the axis X, as illustrated in FIG. 10, the slow wave plate 44, the slot plate 42, and the top plate 40 are overlapped with each other to align the positions of the protrusion 44a of the slow wave plate 44, the slot 42a of the slot plate 42, and the injection port 40d of the top plate 40 to configure the antenna 22a, for example, as illustrated in FIG. 10. Since each of the slow wave plate 44, the slot plate 42, and the top plate 40 has a substantially regular triangular shape with rounded angles, the plane shape of the antenna 22a when viewed in the direction of the axis X generally becomes the substantially regular triangular shape with rounded angles (rounded corners).

Since the slow wave plate 44 has the substantially regular triangular shape, the microwaves propagated through the coaxial waveguide 22b connected to the gravity center of the slow wave plate 44 are more uniformly propagated in the slow wave plate 44 from the protrusion 44a. Further, since the slot pairs 42c are arranged on the slot plate 42 with the rotational symmetry, the microwaves propagated through the slow wave plate 44 are more uniformly propagated to the top plate 40 through the slot plate 42. As a result, the antenna 22a may radiate more uniform microwaves to the second region R2 from the top plate 40.

Figure 11:
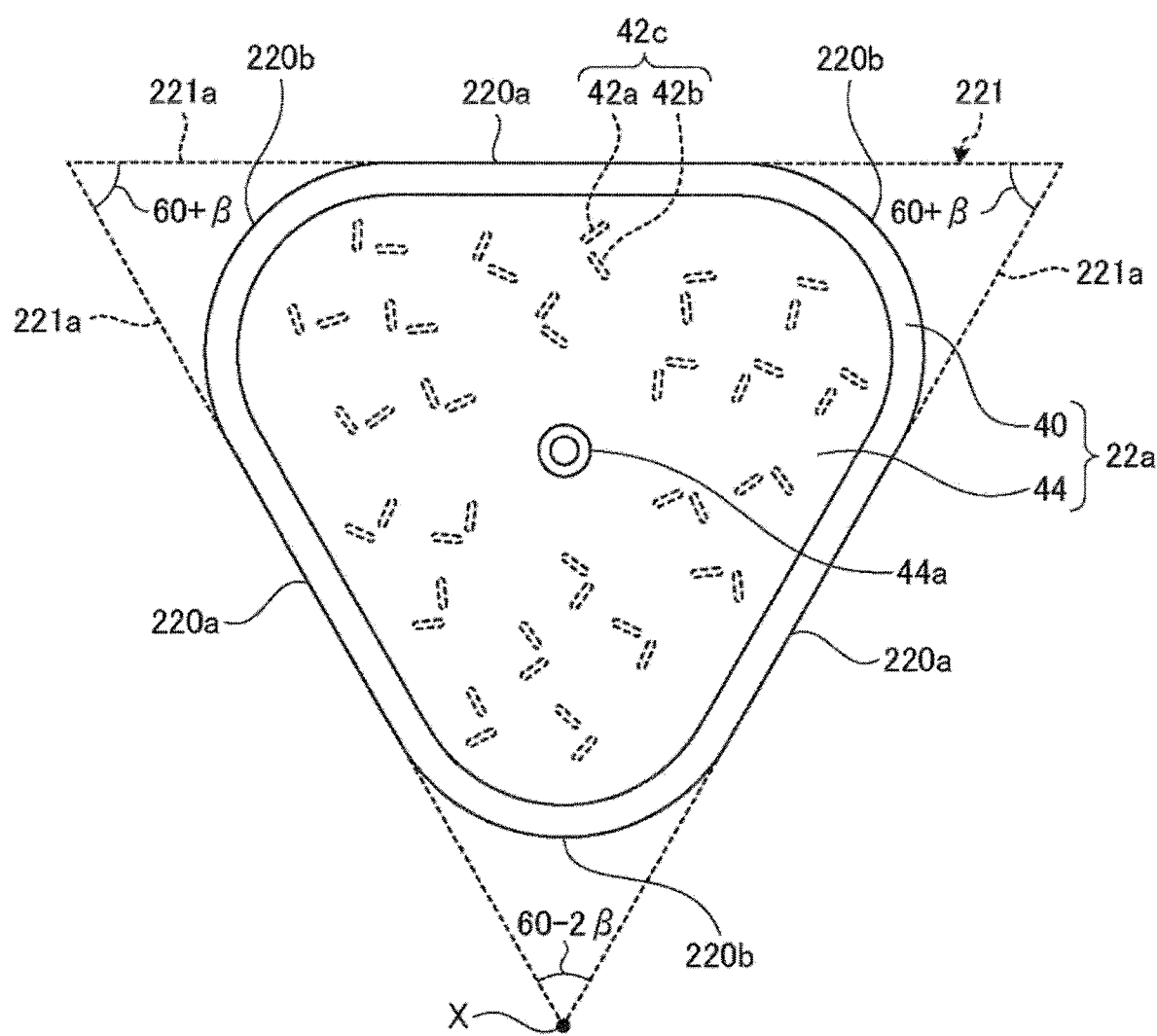
FIG. 11 is a diagram for describing angles of sides of the antenna.

Here, a preferable range of an angle of each side of the antenna 22a will be described. FIG. 11 is a diagram for describing an angle of a side of the antenna 22a. The antenna 22a has, for example, a substantially regular triangular shape in which the angles with rounded angles (rounded corners) when viewed in the direction of the axis X as illustrated in FIG. 11 similarly to the slow wave plate 44 and three lines 22a and three lines 220b are included in a contour thereof. The respective lines 220a are included in respective sides 221a constituting the substantially regular triangular shape 221, respectively. The respective lines 220b connect ends of the contiguous lines 220b by a curve which is convex to the outside of the antenna 22a. Each of the lines 220b is, for example, a part of a circle having a predetermined radius.

The antenna 22a is provided in an aperture AP of an upper member 12b so that the axis C passes one of the apexes of the triangular shape 221 including the contour of the antenna 22a as illustrated in FIG. 11, for example. As illustrated in FIG. 11, among the apexes of the triangular shape 221 including the contour of the antenna 22a, an angle of two sides 221a that extend from an apex that coincides with the axis X is defined as (60−2β) ° and an angle of two sides 221a that extend from each of other apexes is defined as (60+β) °.

Figure 12:
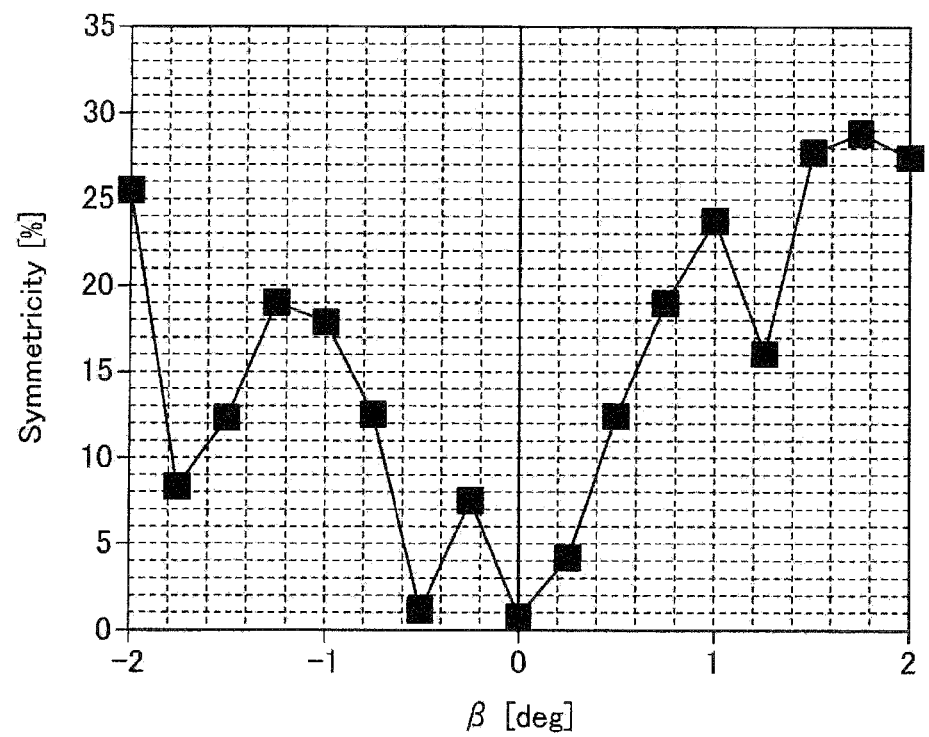
FIG. 12 is a diagram illustrating an exemplary relationship simulation result between angles of sides of the antenna and uniformity of a microwave distribution.

FIG. 12 is a diagram illustrating an exemplary relationship simulation result between the angles of the sides 221a of the antenna 22a and uniformity of a microwave distribution. As illustrated in FIG. 12, when a value of β is 0 (that is, the triangular shape 221 including each side 221a of the antenna 22a is the regular triangular shape), the uniformity of the microwaves radiated from the antenna 22a is highest and as the value of β increases or decreases from 0, the uniformity of the microwaves deteriorates.

Meanwhile, in FIG. 12, since the uniformity (symmetry of intensity distribution) of the microwaves is calculated by (maximum value−minimum value)/(2×average value), the smaller the value is, the higher the uniformity is. Through the keen examination, it has been found that the uniformity of the microwaves is generally suppressed to 0.5% or less when the value of β is within the range of −0.5 to +0.5.

Figure 13:
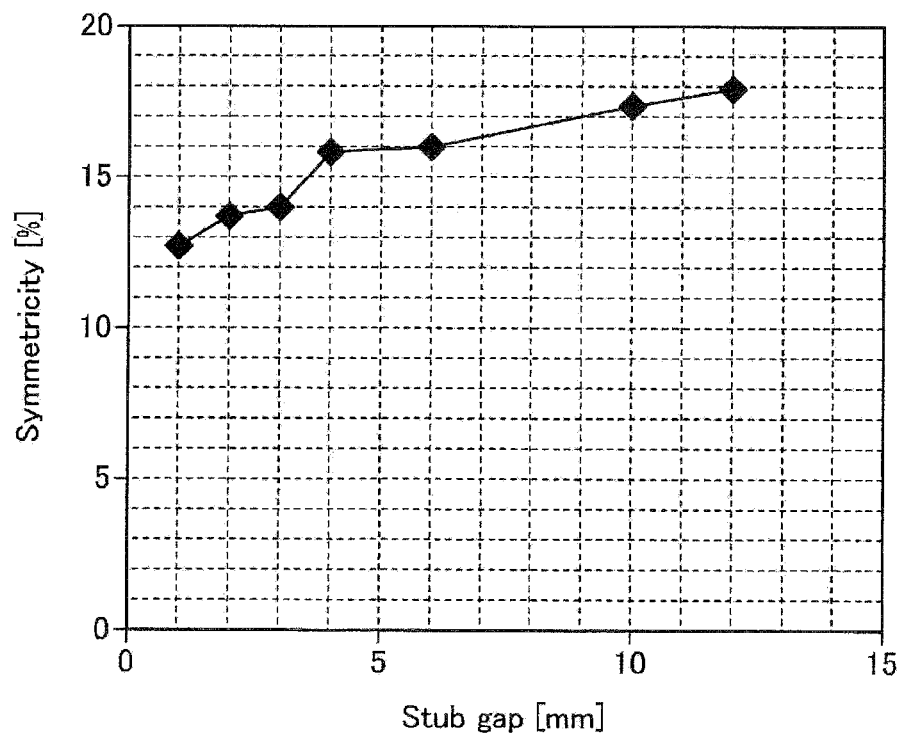
FIG. 13 is a diagram illustrating an exemplary relationship simulation result between an insertion amount of a stub member and the uniformity of the microwave distribution.

FIG. 13 is a diagram illustrating an exemplary relationship simulation result between an insertion amount of a stub member 80 and the uniformity of the microwave distribution. In the graph illustrated in FIG. 13, a horizontal axis indicates a stub gap which is a distance between the front end of the bar shape portion 80b of the stub member 80 and the outer peripheral surface of the inner conductor 62a. Further, an insertion direction of the bar shape portion 80b in the simulation illustrated in FIG. 13 is a direction to face the protrusion 44a (the gravity center of the antenna 22a) on the axis X in the antenna 22a illustrated in FIG. 11.

As apparent from the simulation result of FIG. 13, the uniformity of the microwaves radiated from the antenna 22a varies from approximately 18% to approximately 13% by varying the stub gap. That is, through the keen examination it has been found that the uniformity of the microwaves radiated from the antenna 22a may be enhanced by approximately 5% by controlling the insertion amount of the bar shape portion 80b of the stub member 80.

From the simulation results of FIGS. 12 and 13, among the apexes of the triangular shape 221 including the contour of the antenna 22a, when the angle of two sides 221a that extend from the apex through which the axis X passes is within the range of 60°±1° and the angle of two sides 221a that extend from each of other apexes is within the range of 60°±0.5°, the deterioration of the uniformity of the microwaves may be suppressed to approximately 5% or less. In addition, when the deterioration of the uniformity of the microwaves is within 5%, the deterioration of the uniformity of the microwaves may be offset by the insertion amount of the bar shape portion 80b of the stub member 80.

Figure 14:
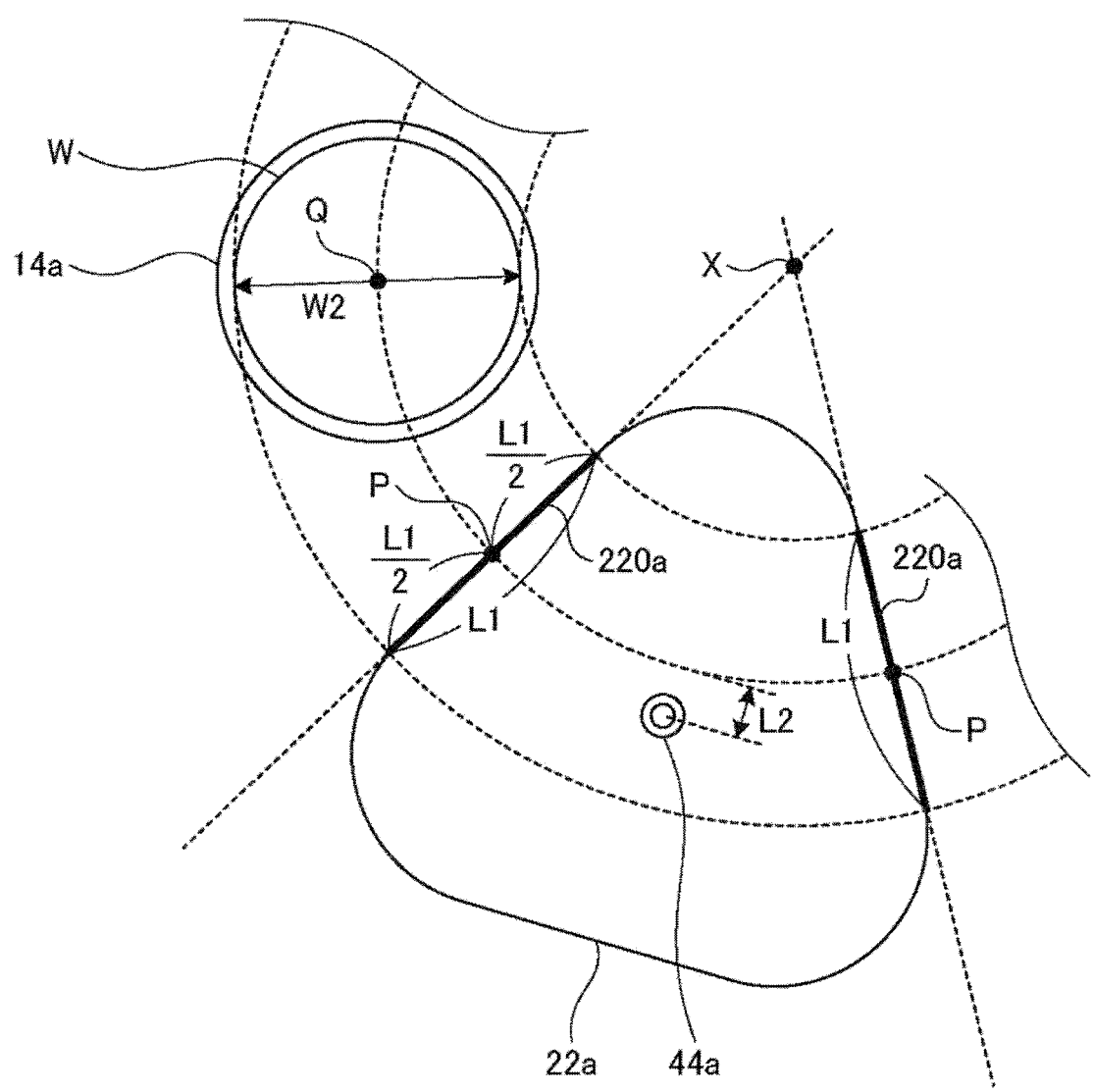
FIG. 14 is a diagram for describing an exemplary relationship between the position of the side of the antenna and a passage region of a substrate.

FIG. 14 is a diagram for describing an exemplary relationship between the position of the lines 220a of the antenna 22a and a passage region of a substrate W. The antenna 22a is provided in the aperture AP of the upper member 12b so that the axis X passes one of the apexes of the triangular shape 221 including the contour of the antenna 22a. The antenna 22a is provided in the aperture AP of the upper member 12b so that each of two lines 220a included in the contour of the antenna 22a is positioned on a straight line extending in the radial direction from the axis X, for example, in a plane orthogonal to the axis X.

The antenna 22a may be formed so that the length L1 of the straight shaped line 220a is larger than the diameter W2 of the substrate W. In addition, in the antenna 22a, when viewed in the direction of the axis X, while the substrate W placed on the substrate placing region 14a of the placing table 14 passes below the antenna 22a as the placing table 14 is rotated, the substrate W may be positioned to wholly pass through the inside of each line 220a. As described above, the substrate W wholly passes below the lines 220a that extend in the radial direction from the axis X to make the exposure time of the substrate W to the plasma generated by the plasma generating section 22 be constant at each position on the substrate W regardless of a distance from the axis X.

When viewed in the direction of the axis X, the antenna 22a may be placed on the upper member 12b so that the centers P of the lines 220a are positioned on a trajectory through which the center Q of the substrate W passes. As a result, the substrate W may be made to pass a more uniform plasma region. Meanwhile, when the antenna 22a is placed so that the centers P of the lines 220a are positioned on the trajectory, along which the center Q of the substrate W moves, the gravity center (the position of the protrusion 44a to which the microwaves are provided from the coaxial waveguide 22b) of the antenna 22a is separated from the trajectory, along which the center Q of the substrate W moves in a direction opposite to the axis X by a predetermined distance L2.

Hereinabove, an exemplary embodiment has been described.

According to the substrate processing apparatus 10 of the exemplary embodiment, the uniformity of the generated plasma may be increased while variation in a passing time through the region of the plasma between respective positions on the wafer W pass may be suppressed to be low.

Meanwhile, in the exemplary embodiment described above, the antenna 22a of each plasma generating section 22 is fixed to the aperture AP of the upper member 12b, but the present disclosure is not limited thereto. For example, each antenna 22a may be attached to the aperture AP of the upper member 12b to be movable in the radial direction of the substantially cylindrical processing container 12. As a result, the distribution of the plasma generated by the plasma generating section 22 may be minutely adjusted in the radial direction of the processing container 12.

In the exemplary embodiment, the contour of the antenna 22a is the substantially regular triangular shape with rounded angles, but the present disclosure is not limited thereto. For example, the contour of the antenna 22a may be, for example, a fan shape when the contour of the antenna 22a is a shape in which line segments constituting the plane shape when viewed in the direction of the axis X include two line segments which are spaced to be distant from each other as being separated away from the axis X. However, even in this case, the microwaves are supplied to the antenna 22a from the center (for example, the gravity center) of the antenna 22a by the coaxial waveguide 22b. As a result, the heat of the antenna 22a may be efficiently dissipated from the cooling plate 46 which is in close contact with the top of the antenna 22a while the variation in a passing time through the plasma region between respective positions on the substrate may be suppressed to be low. Further, in the above-mentioned exemplary embodiments, the antenna 22a includes the top plate 40, but the present disclosure is not limited thereto. The antenna 22a may not include the top plate 40. In this case, the antenna 22a functions as a conductive electrode which is exposed under vacuum. Further, the material of the placing table 14 may be conductive or dielectric. Further, gases may be supplied from the top plate 40 or the electrode.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a placing table configured to place a processing target substrate thereon and provided to be rotatable around an axis such that the processing target substrate moves around the axis;
    a gas supplying section configured to supply gas to each of a plurality of regions through which the processing target substrate sequentially passes while being moved in a circumferential direction with respect to the axis as the placing table is rotated; and
    a plasma generating system configured to generate plasma in a plasma generation region which is one of the plurality of regions, using the gas supplied to the plasma generation region,
    wherein the plasma generating section includes an antenna configured to radiate high frequency waves to the plasma generation region, and a power feeding unit configured to supply the high frequency waves to the antenna,
    wherein a plane shape of the antenna when viewed in a direction along the axis has a substantially regular triangular shape comprising three rounded corners and three linear segments connecting the three rounded corners to each other, the three linear segments including two line segments, and each of the two line segments is positioned along a radial line extending from the axis, and
    wherein the power feeding unit is connected to a gravity center of the substantially regular triangular shaped antenna and supplies the high frequency waves toward the gravity center of the substantially regular triangular shaped antenna,
    wherein the gravity center of the substantially regular triangular shaped antenna has an aperture formed therein which passes through from a top of the antenna to a bottom of the antenna in a thickness direction of the substantially regular triangular shaped antenna; and
    wherein the plasma generating section further includes a stub that is inserted into the power feeding unit and wherein the stub is movably mounted to control an insertion amount of the stub.

2. The substrate processing apparatus of claim 1, wherein the plane shape of the antenna when viewed in the direction along the axis has rotational symmetry.

3. The substrate processing apparatus of claim 1, wherein each of the two line segments is longer than a diameter of the processing target substrate having a disc shape, and
    the antenna is provided in the plasma generation region so that the processing target substrate on the placing table passes through an inside of two line segments when viewed in the direction along the axis.

4. The substrate processing apparatus of claim 1, wherein the antenna is provided in the plasma generation region so that the center of the processing target substrate on the placing table passes through the centers of two line segments when viewed in the direction along the axis.

5. The substrate processing apparatus of claim 1, wherein the two line segments are connected by a curve which is a part of a circle having a predetermined radius.

6. The substrate processing apparatus of claim 1, wherein the plane shape of the antenna when viewed in the direction along the axis is constituted such that, in three interior angles of a substantially regular triangular shape formed when each of three sides constituting plane shape extends, one interior angle is within a range of 60°±1° and the other two interior angles are within a range of 60°±0.5°.

7. The substrate processing apparatus of claim 1, wherein the high frequency waves are microwaves.

8. The substrate processing apparatus of claim 7, wherein the power feeding unit is a coaxial waveguide.

9. The substrate processing apparatus of claim 8, wherein the antenna includes:
    a first dielectric;
    a slot plate provided on the first dielectric and connected with an inner conductor of the coaxial waveguide;
    a second dielectric provided on the slot plate; and
    a cooling plate provided on the, second dielectric and having a flow path for circulating coolant therein,
    the slot plate includes a plurality of slot pairs each having two slots formed to be aligned side by side in concentric circular shapes having different radii around a position where the inner of the coaxial waveguide is connected when viewed in a direction along the axis, and the plurality of slot pairs is formed on the slot plate to be rotationally symmetric when viewed in the direction along the axis.

10. The substrate processing apparatus of claim 9, further comprising:
a pressing unit disposed, so as to press the cooling plate against the second dielectric,
wherein the cooling plate, the second, dielectric, the slot plate, and the first dielectric are in close contact with each other by a pressing force of the pressing unit.

11. The substrate processing apparatus of claim 1, wherein an end of the power feeding unit is inserted into the aperture.

12. The substrate processing apparatus of claim 1, wherein the substantially regular triangular shaped antenna has a ring-shaped projection which protrudes downwardly toward the plasma generating region, and the aperture passes through the ring-shaped protection and communicates with the plasma generating region.

13. The substrate processing apparatus of claim 1, wherein the antenna includes a cooling plate, and the stub is movably mounted to the cooling plate.

14. The substrate processing apparatus of claim 13, wherein a lowermost portion of the antenna is formed of a dielectric material which is exposed to the plasma generation region.

15. A substrate processing apparatus comprising:
a placing table configured to place a processing target substrate thereon and provided to be rotatable around an axis such that the processing target substrate moves around the axis;
a gas supplying section configured to supply gas to each of a plurality of regions through which the processing target substrate sequentially passes while being moved in a circumferential direction with respect to the axis as the placing table is rotated; and
a plasma generating system configured to generate plasma in a plasma generation region which is one of the plurality of regions, using the gas supplied to the plasma generation region,
wherein the plasma generating section includes an antenna configured to radiate high frequency waves to the plasma generation region, and a power feeding unit configured to supply the high frequency waves to the antenna,
wherein a plane shape of the antenna when viewed in a direction along the axis has a substantially regular triangular shape comprising three rounded corners and three linear segments connecting the three rounded corners to each other, the three linear segments including two line segments, and each of the two line segments is positioned along a radial line extending from the axis, and
wherein the power feeding unit is connected to a gravity center of the substantially regular triangular shaped antenna and supplies the high frequency waves toward the gravity center of the substantially regular triangular shaped antenna,
wherein the gravity center of the substantially regular triangular shaped antenna has an aperture formed therein which penetrates in a thickness direction of the substantially regular triangular shaped antenna; and
wherein inside of a perimeter of the substantially regular triangular shape, the antenna includes a protrusion which extends downward toward the plasma generation region, and wherein the aperture passes through the protrusion and the aperture communicates with the plasma generation region through the protrusion.

16. The substrate processing apparatus of claim 15, wherein a lowermost portion of the antenna is formed of a dielectric material which is exposed to the plasma generation region and the protrusion is formed of the dielectric material.

17. The substrate processing apparatus of claim 15, wherein the plasma generating section further includes a stub that is inserted into the power feeding unit and wherein the stub is movably mounted to control an insertion amount of the stub.

18. The substrate processing apparatus of claim 17, wherein the antenna includes a cooling plate, and the, stub is movably mounted to the cooling plate.

19. The substrate processing apparatus of claim 18, wherein a lowermost portion of the antenna is formed of a dielectric material which is exposed to the plasma generation region and the protrusion is formed of the dielectric material.

20. The substrate processing apparatus of claim 19, wherein a plurality of movably mounted stubs are provided at a location vertically above the protrusion.

21. The substrate processing apparatus of claim 20, wherein the antenna further includes a slot plate above the dielectric material, and the slot plate includes a plurality of slot pairs arranged along plural concentric circles about the aperture.

* * * * *